US006194737B1

(12) United States Patent
Ohshima (10) Patent No.: US 6,194,737 B1
(45) Date of Patent: Feb. 27, 2001

(54) PHASE-LOCKED CIRCUIT DEVICE USING A SINGLE-ELECTRON TUNNELING JUNCTION ELEMENT AND METHOD OF FABRICATING THE SAME

(75) Inventor: Toshio Ohshima, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/124,917

(22) Filed: Jul. 30, 1998

(30) Foreign Application Priority Data

Dec. 24, 1997  (JP) ................................... 9-355703

(51) Int. Cl.[7] ............................ H01L 29/06; H01L 39/00
(52) U.S. Cl. ................................. 257/30; 257/31
(58) Field of Search .......................... 257/30, 31, 34

(56) References Cited

U.S. PATENT DOCUMENTS

| 4,559,549 | * | 12/1985 | Roberts et al. . |
| 4,813,016 | * | 3/1989 | Okada et al. . |
| 5,077,762 | * | 12/1991 | Morimoto et al. . |
| 5,140,398 | * | 8/1992 | Matsuda et al. . |
| 5,731,717 | * | 3/1998 | Oshima et al. . |
| 6,057,556 | * | 5/2000 | Gubin et al. . |

FOREIGN PATENT DOCUMENTS 7-263960   10/1995   (JP) .

* cited by examiner

Primary Examiner—Stephen D. Meier
(74) Attorney, Agent, or Firm—Armstrong, Westerman, Hattori, McLeland & Naughton

(57) ABSTRACT

This invention is characterized in that a load resistor is constituted of a tunneling junction element(12), and a single-electron tunneling junction element(10) and the tunneling junction element(12) for load resistor are laminated to design a phase-locked circuit compact. Further, the load resistor(12) is comprised of a plurality of laminated tunneling junctions for load resistor so that the load resistor can have the proper resistance. A DC bias voltage is applied to the electrode(37) of the tunneling junction element for load resistor, and an AC pump voltage to one electrode(20) of the single-electron tunneling junction element. In the case of a plurality of phase-locked circuit gates, one electrodes of the single-electron tunneling junction elements are designed into a common electrode to which the AC pump voltage is applied, and the other electrodes are formed apart from one another two-dimensionally. Then, the phase-locked circuit gates can be formed compact by laminating the tunneling junction elements for load resistor on the other electrodes. To achieve the above structure, the dielectric constant of the insulator layer of the tunneling junction element for load resistor is made larger than that of the insulator layer of the single-electron tunneling junction element.

8 Claims, 10 Drawing Sheets

$\omega_{SET} = 2\pi I/e$

| | | SINGLE-ELECTRON JUNCTION | | JUNCTION FOR RESISTOR | | COUPLING JUNCTION | |
|---|---|---|---|---|---|---|---|
| e1 | e2 | C (aF) | RT (RQ UNITS) | C (aF) | RT (RQ UNITS) | C (aF) | RT (RQ UNITS) |
| (a) 3.8 | 3.8 | 2 | 10 | 2 | 10 | 0.4 | 500 |
| (b) 3.8 | 19 | 2 | 10 | 10 | 0.1 | 0.4 | 500 |
| (c) 3.8 | | 2 | 10 | 10 | 10 | 1 | 500 |

PHASE-LOCKED CIRCUIT DEVICE USING A SINGLE-ELECTRON TUNNELING JUNCTION ELEMENT AND METHOD OF FABRICATING THE SAME

BACKGROUND OF THE INVENTION

1. Field of the Invention

The present invention relates to novel structures of an arithmetic operation unit and a memory device, which utilize two phase states that are acquired by applying a DC bias voltage to single-electron tunneling (SET) junction elements via a series resistor and then applying an AC pump signal thereto to thereby allow the voltage between the junctions of the SET junction elements to be phase-locked to the AC pump signal, and a method of manufacturing the same.

2. Description of the Related Art

Recently have extensive studies been made on a single-electron tunneling effect which permits electrons to tunnel through a thin insulator layer with a small area, placed between two semiconductor layers or metal films, one by one. This invention provides novel structures of an arithmetic operation unit and a memory device, which utilize two stable phase states acquired by implementing phase-locking to an AC pump using the nonlinear characteristics that appear on a single-electron tunneling junction element (hereinafter simply called "SET junction element") that produces such a single-electron tunneling effect.

A phase-locked arithmetic operation circuit and memory circuit which utilize such an SET junction element are disclosed in, for example, the paper written by the present inventor and entitled "Structure of Single-electron Tunneling Phase Logic" in Papers ED96-218 (March 1997) in Institute of Electronic Information Communication Engineering. A device which uses two phase states produced by applying a pump signal of twice the frequency of SET oscillation to an SET junction element has been proposed by Mr. Kiehl in Japanese Patent Application, KOKAI Publication No. 6-48213.

However, most of the conventional reports on SET junction elements simply cover their simulation analysis and operations, and no specific device architectures or no specific fabrication methods therefor have been proposed yet. While theoretically effective operations of phase-locked circuits using SET junction elements have been confirmed and are expected to solve problems of CMOS circuits, currently used widely, on dissipation power and the limited integration scale, which will surely arise in the near future, therefore, there is a strong demand of studying actual structures.

SUMMARY OF THE INVENTION

Accordingly, it is an object of the present invention to provide a novel structure of a phase-locked logic and memory circuit device, which use SET junction elements proposed by the present inventor et al., and a method of fabricating those devices.

To achieve this object, this invention is characterized in that a load resistor is constituted of a tunneling junction element, and a single-electron tunneling junction element and the tunneling junction element for load resistor are laminated to design a phase-locked circuit compact. Further, the load resistor is comprised of a plurality of laminated tunneling junctions for load resistor so that the load resistor can have the proper resistance. A DC bias voltage is applied to the electrode of the tunneling junction element for load resistor, and an AC pump voltage to one electrode of the single-electron tunneling junction element. In the case of a plurality of phase-locked circuit gates, one electrodes of the single-electron tunneling junction elements are designed into a common electrode to which the AC pump voltage is applied, and the other electrodes are formed apart from one another two-dimensionally. Then, the phase-locked circuit gates can be formed compact by laminating the tunneling junction elements for load resistor on the other electrodes.

To achieve the above structure, the dielectric constant of the insulator layer of the tunneling junction element for load resistor is made larger than that of the insulator layer of the single-electron tunneling junction element. Further, both insulator layers are formed to have substantially the same thickness. Furthermore, coupling capacitors between the gates are formed between the other electrodes of the single-electron tunneling junction elements, which are formed apart from one another.

To achieve the object, a phase-locked circuit device comprises:

a single-electron tunneling junction element having ultrasmall tunnel junction;

a tunneling junction element for resistance having one end connected to a first electrode of said single-electron tunneling junction element and an other end applied with a DC bias voltage, said tunneling junction element for resistance forming a load resistor; and an AC voltage source for applying a voltage to a second electrode of said single-electron tunneling junction element, a junction of said single-electron tunneling junction element being formed by a first insulator layer, a junction of said tunneling junction element for resistance being formed by a second insulator layer having a larger dielectric constant than that of said first insulator layer.

To achieve the object, according to this invention, a method of fabricating a phase-locked circuit device having a single-electron tunneling junction element and a load resistor, connected to said single-electron tunneling junction element and applied with a DC bias voltage, an AC pump voltage being applied to said single-electron tunneling junction element, said method comprises the steps of:

forming a first electrode of said single-electron tunneling junction element on a substrate;

forming a first insulator layer for forming a junction of said single-electron tunneling junction element on said first electrode;

forming a second electrode of said single-electron tunneling junction element on said first insulator layer;

forming a second insulator layer having a greater dielectric constant than that of said first insulator layer on said second electrode; and forming on said second insulator layer an electrode for resistance constituting a tunnel junction for resistance constituting said load resistor and facing said second electrode, wherein said tunnel junction for resistance is formed by said second electrode, said second insulator layer and said electrode for resistance.

DETAILED DESCRIPTION OF THE PREFERRED EMBODIMENT

A preferred embodiment of the present invention will now be described with reference to the accompanying drawings. It is to be noted however that this embodiment does not in any way limit the scope of the invention.

Figure 1:
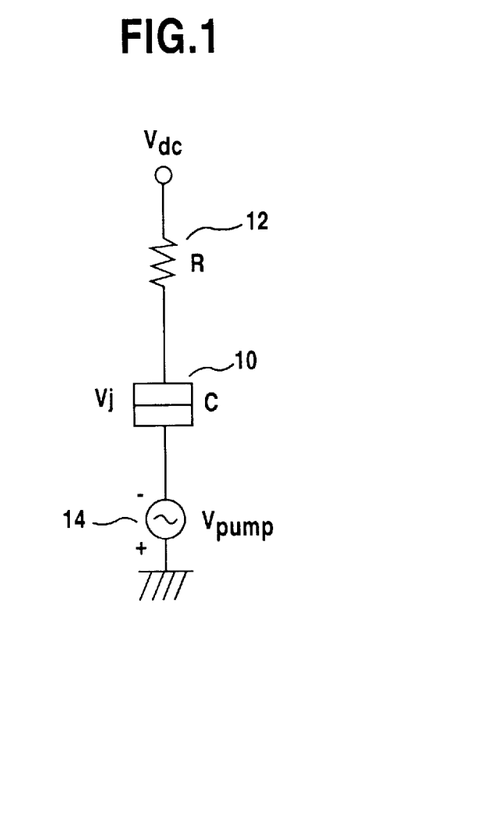
FIG. 1 is a basic circuit diagram of a TPL (Tunneling Phase Logic) phase-locked circuit.

FIG. 1 is a basic circuit diagram of a TPL (Tunneling Phase Logic) phase-locked circuit. This basic circuit has an SET junction element 10, which has an ultrasmall tunnel junction and produces an SET effect, a DC voltage source Vdc, a bias resistor 12 and a pump 14 for supplying an AC voltage.

Figure 2:
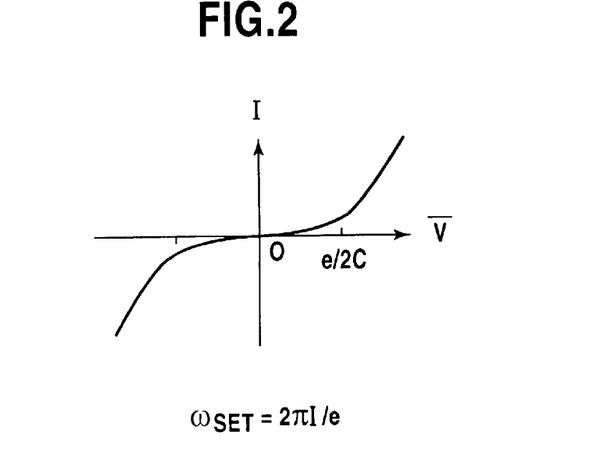
FIG. 2 is a diagram showing the current-voltage characteristics of a single-electron tunneling (SET) junction element.

This SET junction element 10 has a sufficiently small junction formed through an insulator layer, the junction having a very small capacitance C. As the size of the junction decreases, the Coulomb interaction gets greater, causing correlative electron tunneling. At a sufficiently low temperature, therefore, the current-voltage characteristics of the SET junction element become nonlinear characteristics called "Coulomb blockage" as shown in FIG. 2. Specifically, when a voltage V to be applied between both electrodes of the SET junction element 10 is near 0, the electrostatic energy that is determined by the capacitor present in the SET junction element is too large to permit the flow of the current. A threshold voltage Vt at which the current starts flowing between both electrodes of the SET junction element is expressed by Vt=e/2C.

Figure 3:
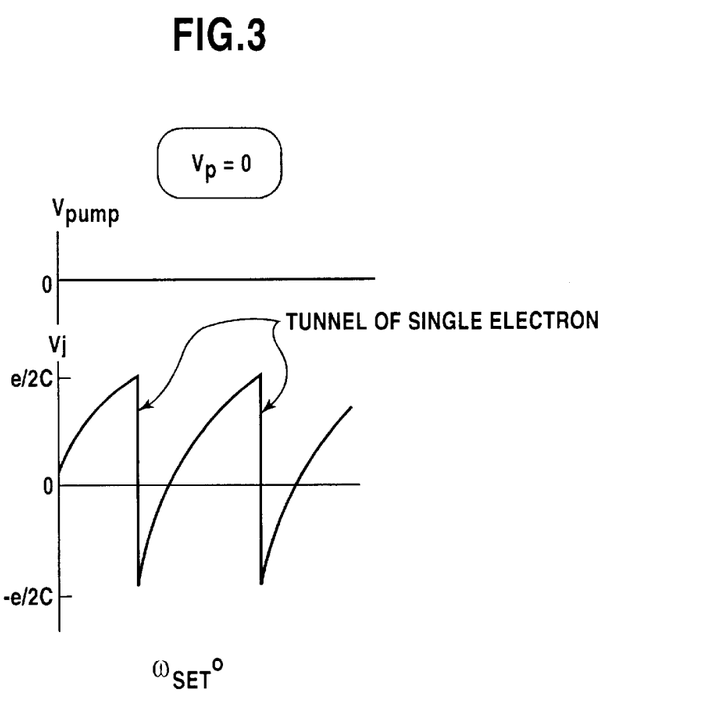
FIG. 3 is a diagram depicting the junction voltage characteristics when only a DC bias is applied to an SET junction element.

When a DC bias is applied to the SET junction element, therefore, the junction voltage characteristics as shown in FIG. 3 are demonstrated. Specifically, as the capacitor in the junction of the SET junction element is charged and the junction voltage rises above the threshold voltage (Vt=e/2C), a single electron tunnels through the junction and this tunneling causes the current to flow, thus reducing the charges in the capacitor. Repeating this operation causes the junction voltage Vj to oscillate at a given frequency ωset. This oscillation of the SET junction element is called single-electron tunneling oscillation or SET oscillation. With I being the average current flowing across the SET junction element, the frequency ωset is expressed by 2πI/e.

Figure 4:
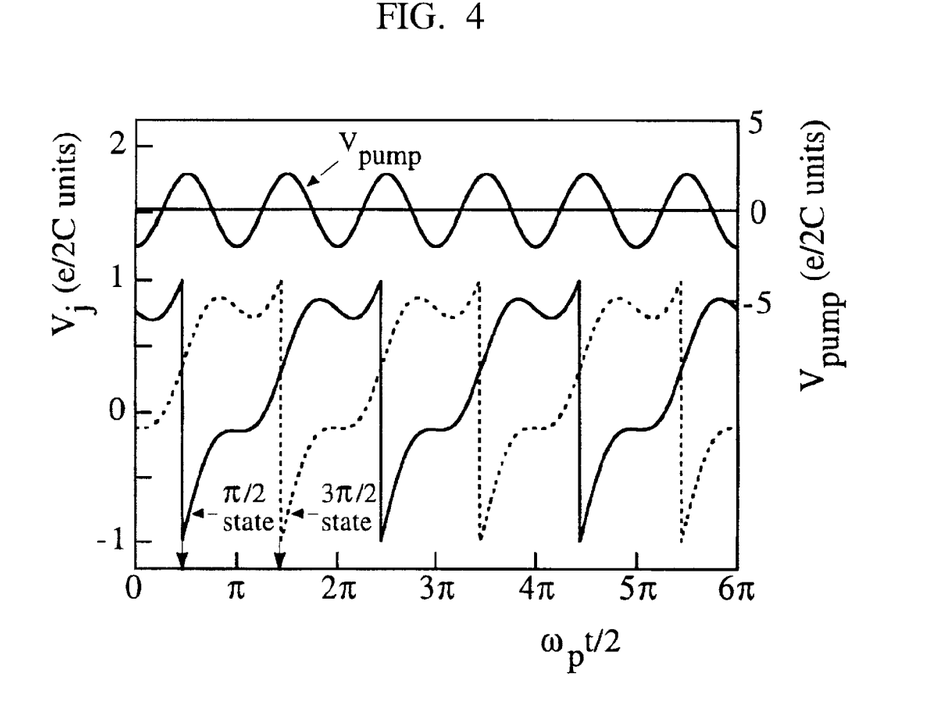
FIG. 4 is a diagram illustrating the junction voltage characteristics when a pump voltage is applied to the TPL phase-locked circuit in FIG. 1.

When a DC bias voltage is applied to the SET junction element 10 via the bias resistor 12 and an AC pump voltage of a frequency ωp and amplitude Vpump is supplied to the SET junction element 10 from the pump 14 as shown in FIG. 1, the frequency ωset of the SET junction element 10 is pulled into a half the frequency ωp of the AC pump signal and becomes stable, as shown in FIG. 4. This phase locking can provide two phase states shifted from each other by a half the cycle of the frequency ωp of the AC pump signal. Those two phase states as phase logic states can thus be used as units for expressing information.

Figure 5:
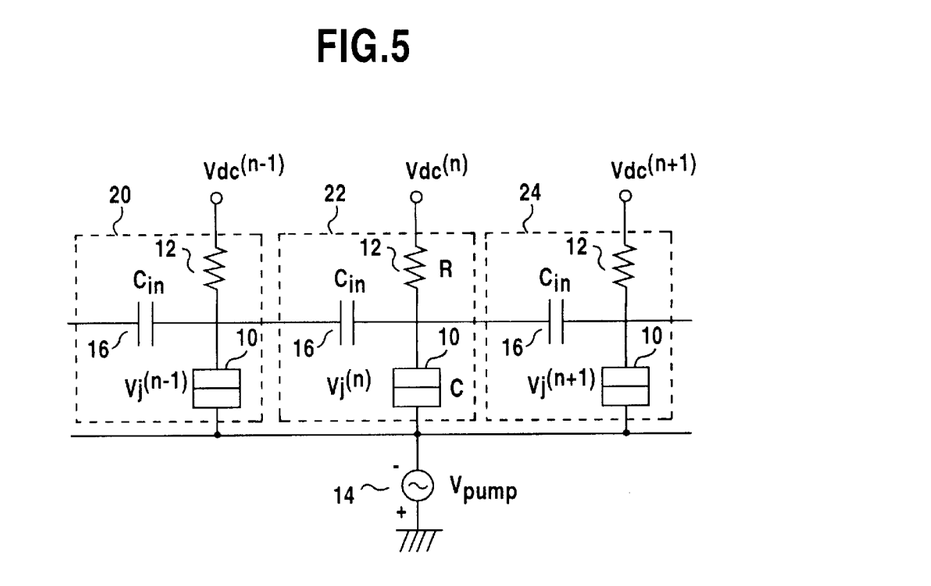
FIG. 5 is a diagram showing an example of a TPL phase-locked circuit.

FIG. 5 is a diagram showing an example of a TPL phase-locked circuit. In this example, three basic gates 20, 22 and 24 each of the type shown in FIG. 1 are connected in series. Each gate has an SET junction element 10 with a capacitance C and a tunnel resistance $R_T$, a load resistor 12, a DC bias voltage source Vdc and a pump 14. It is to be noted that the pump 14 is common to the individual gates, and is commonly connected to one electrodes of the SET junction elements 10. The gates are connected together by coupling capacitors 16 of a capacitance Cin.

As mentioned above, each gate of TPL phase-locked circuit has two oscillation states whose phases are shifted by π from each other, due to the generation of SET oscillation which is locked to the pump voltage and has a half the frequency of the pump voltage. With those gates connected as shown in FIG. 5, when an oscillation at a preceding stage is in one phase state, pulling up the DC bias of the succeeding stage renders the succeeding gate into a phase state corresponding to that of the preceding stage. Specifically, when the gate 20 is in one phase state, pulling up the DC bias of the gate 22 renders the gate 22 into the other phase state. If the preceding stage consists of an odd number of gates, the inverted phase state is rendered by the majority logic. Those operations are described in, for example, the paper written by the present inventor and entitled "Structure of Single-electron Tunneling Phase Logic" in Papers ED96-218 (March 1997) in Institute of Electronic Information Communication Engineering.

Figure 6:
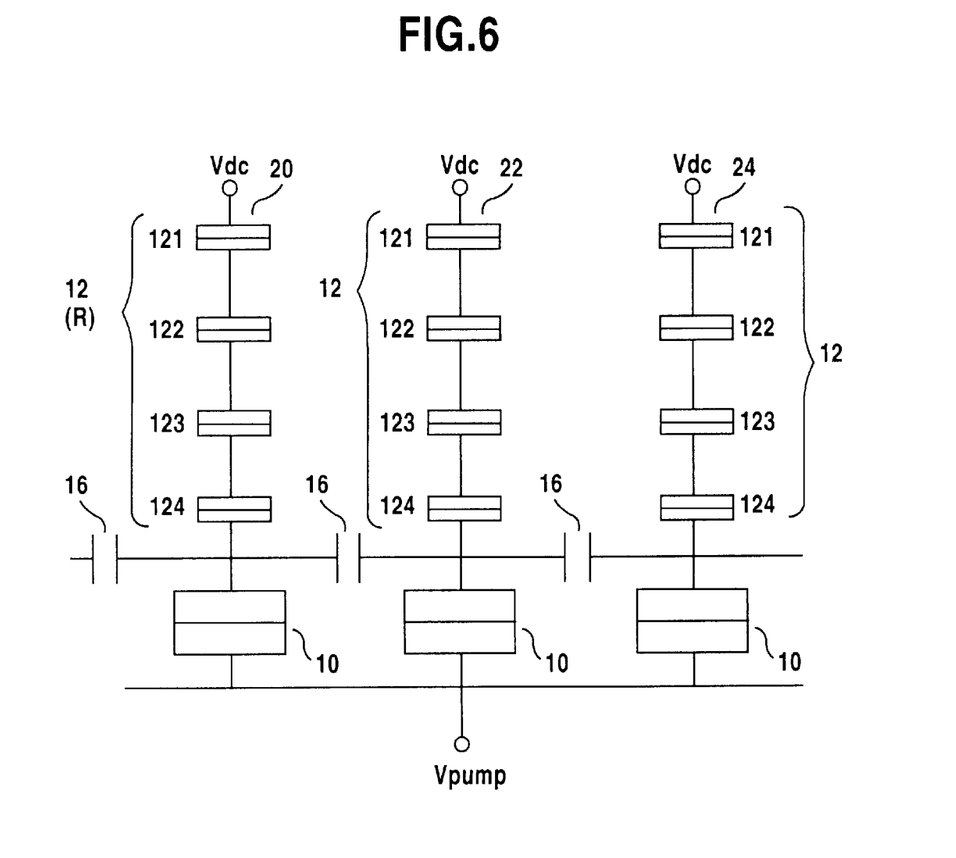
FIG. 6 exemplifies the specific structure of a TPL phase-locked circuit.

This invention proposes a novel structure for constructing a TPL phase-locked circuit as shown in FIG. 5. FIG. 6 exemplifies the specific structure of a TPL phase-locked circuit. FIG. 6, like FIG. 5, shows the structure with three gates 20, 22 and 24. One electrodes of the SET junction elements 10 of the individual gates are connected together to an unillustrated pump voltage source Vpump. Each load resistor 12 is constituted by connecting four tunneling junction elements 121 to 124 in series. Those tunneling junction elements constituting the load resistor 12 has an ordinary tunneling phenomenon, not a single-electron tunneling phenomenon, and has a constant tunnel resistor $R_T$. The series-connected tunnel resistors $R_T$ constitute the load resistor 12. A coupling capacitor 16 for a preceding stage and a succeeding stage is connected to a node between the SET junction element 10 and the load resistor 12.

The above structure allows a TPL circuit to be constituted only by junctions which is formed by an insulator and conductors (which may include both a conductor like metal and a semiconductor like silicon).

Figure 7:
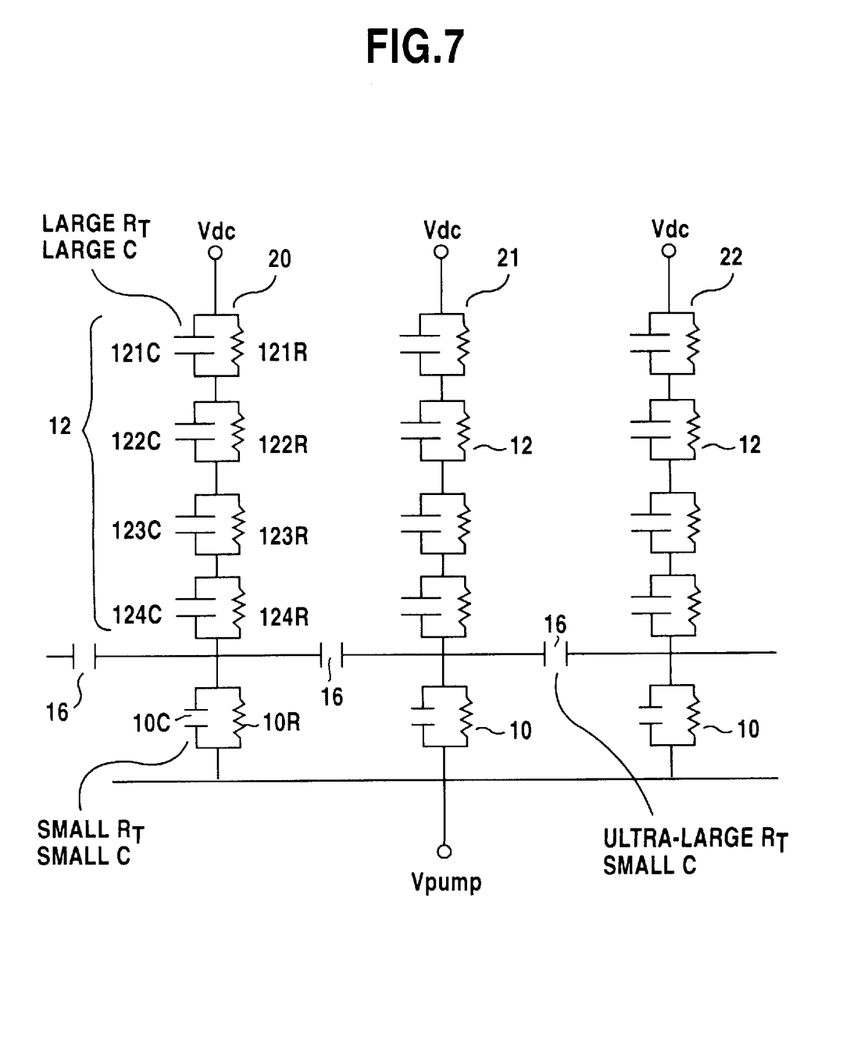
FIG. 7 is an equivalent circuit diagram of the TPL phase-locked circuit in FIG. 6.

FIG. 7 is an equivalent circuit diagram of the TPL phase-locked circuit in FIG. 6. The SET junction element 10 and the tunneling junction elements 121–124 can each be expressed by a parallel circuit of a junction capacitor C and a tunnel resistor $R_T$. Specifically, the insulator layer of the SET junction element 10 should be formed very thin and the capacitance C thereof should be very small in order to produce the SET phenomenon, while the junction capacitance of each of the tunneling junction elements 121–124 which constitute the load resistor 12 should be set sufficiently large to produce the ordinary, Poisson-process initiated tunneling phenomenon, not the SET phenomenon. The coupling capacitor 16 is demanded to serve as an ordinary coupling capacitor which does not cause the tunneling phenomenon. Therefore, the insulator layer of the coupling capacitor 16 should be relatively thick.

As the junction size of the SET junction element 10 is reduced sufficiently to set the capacitance C sufficiently small, the Coulomb interaction becomes greater, causing correlative electron tunneling, so that periodic SET oscillations occur. It is therefore preferable that the capacitance C of the SET junction element 10 be small, for example, 0.1 aF to 10 aF. Further, it is preferable that the tunnel resistance $R_T$ of the SET junction element 10 be as a relatively small value as about 1 to 30 $R_Q$ (quantum resistance $R_Q$=6.46 kΩ). The range of the capacitance is determined by the operational temperature. At a high temperature such as the room temperature, for example, a very small value like 0.1 aF is demanded. At the temperature of liquid nitrogen, even a relatively large value like 10 aF can cause the SET phenomenon. In general, because the thickness of the insulator layer of the junction exponentially influences the tunnel resistor $R_T$, it is necessary to optimize the area of the junction and the dielectric constant of the insulator layer in order to meet the aforementioned tunnel resistance. In the design phase, therefore, a device which operates at the temperature of liquid nitrogen has a higher design freedom.

The lower limit 1 $R_Q$ in the range of 1 to 30 $R_Q$ of the tunnel resistance $R_T$ of the SET junction element 10 means the minimum value that can provide the SET effect. Increasing the tunnel resistance means reduction in the speed of the SET effect, so that the upper limit 30 $R_Q$ of the tunnel resistance $R_T$ can mean the upper limit to ensure the SET oscillation and two phase states.

In consideration of the above conditions, it is desirable that the specific insulator layer of the SET junction element has a dielectric constant of 5 or smaller and a thickness of 2 nm to 200 nm. Since the thickness of the insulator layer of the junction exponentially influences the tunnel resistor $R_T$, as mentioned above, it is preferable to select a material with a small dielectric constant.

To prevent the SET effect from occurring, the capacitance of each of the tunneling junction elements 121–124 that constitute the load resistor 12 should preferably be greater by a factor of, for example, 50 or more than the capacitance of the SET junction element 10. This necessitates that the capacitance of each of the tunneling junction elements 121–124 is 5 aF or larger, i.g. to 500 aF, while the capacitance of the SET junction element 10 is in the range of 0.1 aF to 10 aF. Although the capacitance of the SET junction element 10 is set to 10 aF in the example of the device which operates at the temperature of liquid nitrogen, it is desirable that the capacitance of the tunneling junction elements 121–124 of the associated load resistor 12 is equal to or greater than 500 aF. If the capacitance of the SET junction element 10 is set to 0.1 aF for an operation at the room temperature, it is preferable to set the capacitance of the tunneling junction elements 121–124 to about 5 aF (about 50 times).

To generate the aforementioned SET oscillation, the tunneling junction elements 121–124 of the load resistor 12 should have a certain high tunnel resistance $R_T$. This is because the CR time constant for charging the capacitor of the SET junction element 10 should be increased to a certain extent to acquire the practical period of the SET oscillation shown in FIG. 3. For instance, the combined load resistor 12 is demanded to have a high resistance of, for example, 100 $R_Q$ or higher for the proper circuit operation. With the load resistor 12 constituted of four tunneling junction elements 121–124 as shown in FIGS. 6 and 7, therefore, a high value of 25 $R_Q$ or higher is preferable. According to this embodiment, the preferable tunnel resistance of the tunneling junction elements is equal to or larger than 25 $R_Q$.

In view of the above conditions, it is desirable that the specific insulator layer of the tunneling junction element for load resistor has a dielectric constant of 5 or greater and a thickness of 2 nm to 200 nm. This layer thickness is determined on the premise that the thickness is set equal to the thickness of the SET junction element. The dielectric constants and areas of both junction elements should thus provide the aforementioned difference in capacitance by a factor of 50 and the aforementioned difference in tunnel resistance.

Because the coupling capacitor 16 needs to serve as an ordinary capacitor to simply transmit the SET oscillation of the voltage in the SET junction at a preceding stage to the succeeding stage, the coupling capacitor 16 should have a very high tunnel resistance, high enough not to cause the tunneling effect, and a very small capacitance which does not reduce the SET oscillation amplitude too much in the gate. For instance, the desirable capacitance is about 0.1 aF to 10 aF, very small and substantially the same as the capacitance of the SET junction element. A value which matches the capacitance of the SET junction element is selected within this range. Further, the required tunnel resistance is equal to or greater than 100 $R_Q$, which does not cause the tunneling effect.

In light of the above conditions, the specific insulator of the coupling capacitor 16 desirably has a dielectric constant of 5 or greater and a thickness of 2 nm to 200 nm. As the coupling capacitor 16 has a significantly high tunnel resistance, even if its dielectric constant is the same as that of the insulator layer which is used for the tunnel junction of the load resistor 12, for example, the capacitance of the coupling capacitor 16 can be reduced by making the insulator layer thereof thicker. In this case, the increased layer thickness increases the tunnel resistance. Alternatively, decreasing the junction area can also reduce the capacitance and increase the tunnel resistance simultaneously.

Figure 8:
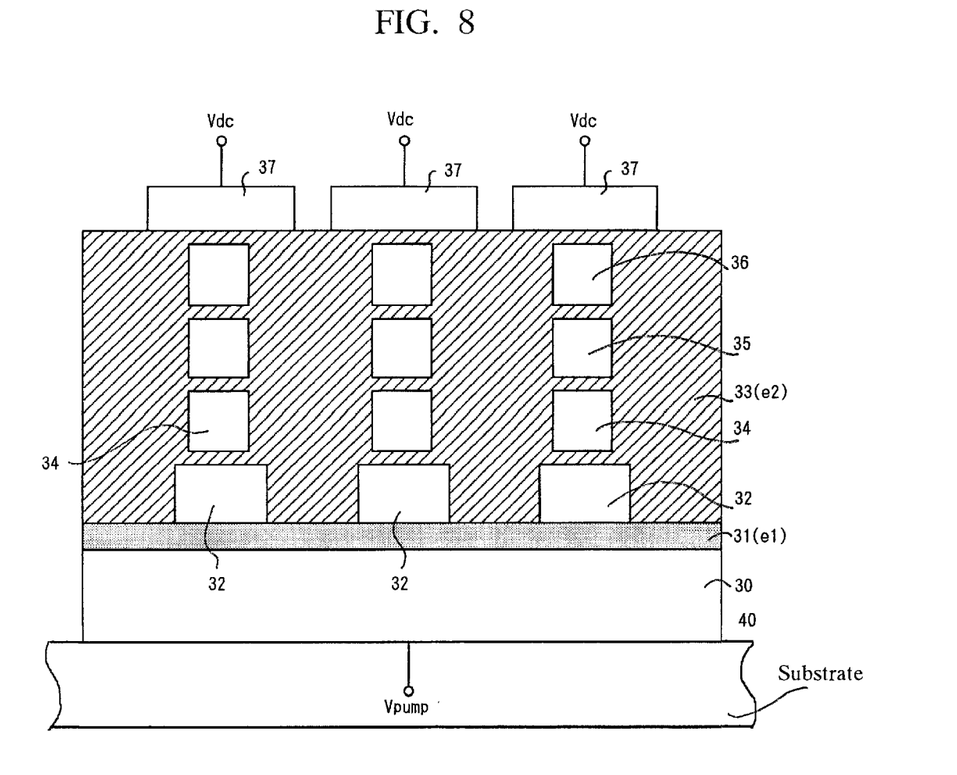
FIG. 8 is a cross-sectional view depicting the specific structure of a TPL circuit.

FIG. 8 is a cross-sectional view depicting the specific structure of a TPL circuit which is constructed in consideration of the above conditions. Formed on a substrate 40 is a common electrode layer 30 on which a first insulator layer 31 is formed. Electrode layers 32 of a conductor (including a semiconductor) for forming SET junction elements of the respective gates are formed on the first insulator layer 31, apart from one another. Electrodes 34, 35, 36 and 37 of tunneling junction elements which constitute the load resistor 12 are formed above each electrode layer 32 via a second insulator layer 33.

As will be understood in comparison with the structural diagram of FIG. 6, the SET junction element 10 and the tunneling junction elements 121–124 for the load resistor are formed in a multilayer structure with respect to the substrate 40. To implement a sufficient load resistor 12, a plurality of tunneling junction elements 121–124 which are to be series-connected are formed in a multilayer structure. The coupling capacitor 16 can be formed in the lateral direction between the electrodes 32 of adjoining SET junction elements by making the horizontal distance between the isolated electrodes 32 of the SET junction elements shorter than the horizontal distance between the electrodes 34, 35 and 36 of the SET junction elements, which formed above the electrodes 32.

Figure 9:
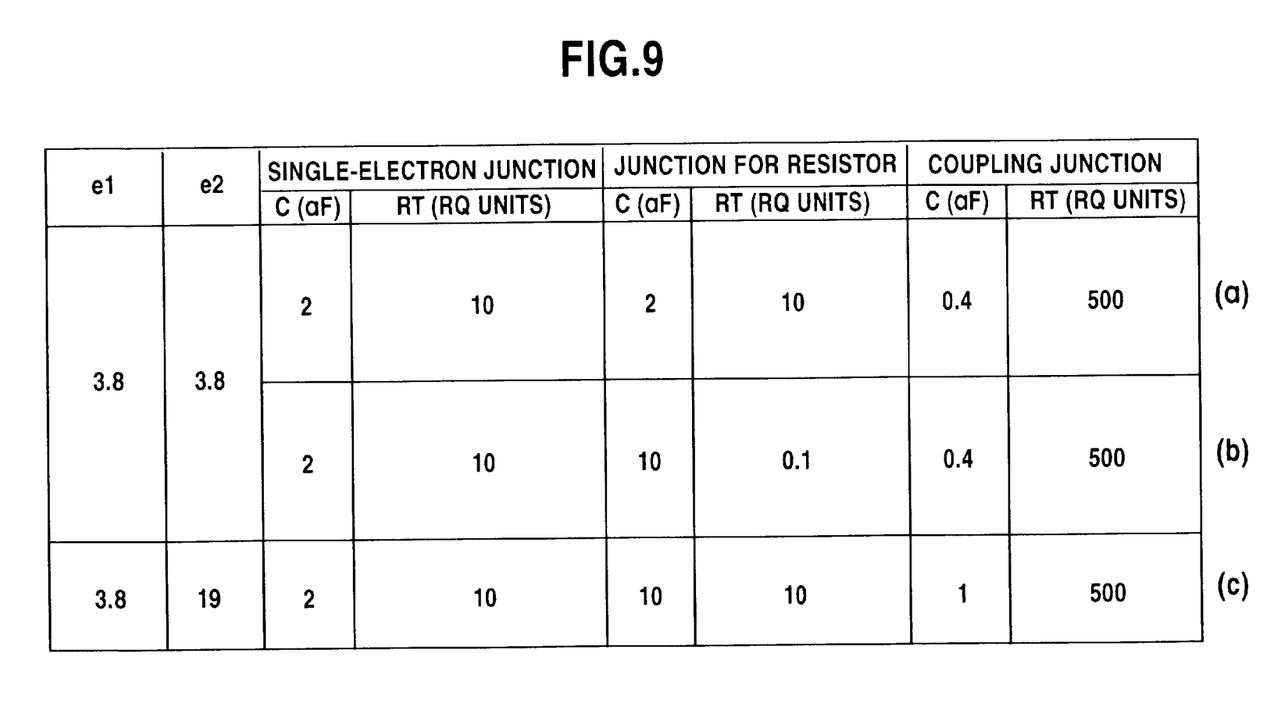
FIG. 9 is a table showing simulated values for capacitances C and tunnel resistances $R_T$ of a single-electron junction, a junction for load resistor and a coupling junction which constitute a TPL circuit.

FIG. 9 shows simulated values for the capacitances C and tunnel resistances $R_T$ of a single-electron junction, a junction for load resistor and a coupling junction which constitute a TPL circuit. Those simulated values are what were acquired when the dielectric constant e1 of the first insulator layer 31 which constitutes the single-electron junction, and the dielectric constant e2 of the second insulator layer 33 which constitutes the junction for resistor and the coupling junction were changed, and the size of each junction is set to the proper one. Note that the thickness of the first insulator layer 31 is set to 20 nm, the thickness of the junction for resistor, formed by the second insulator layer 33, is set to 20 nm for samples of rows (a) and (c) and 2 nm for a sample of row (b), and the thickness of the coupling junction is set to 100 nm. Further, the electrodes 34, 35 and 36 which would form the junction for load resistor have approximately the same area as the area of the electrode 32 which would form each SET junction element.

Row (a) shows the simulation result for a case where the two insulator layers 31 and 33 had the same dielectric constant e1, e2, and the insulator layers between these electrodes 34, 35 and 36 have the same thickness with relatively large value of 20 nm. In this case, while the distance between the electrodes 32 for forming the coupling junction is sufficiently long and the tunnel resistance $R_T$ is 500 $R_Q$, which is sufficiently large, the two insulator layers 31, 33 have the same dielectric constant, so that the capacitance C becomes too small (0.4 aF). Therefore, while the coupling capacitor has a tunnel resistance large enough not to cause the tunneling effect, which is preferable, the coupling capacitor undesirably has an insufficient capacitance. The single-electron junction and the junction for load resistor have the same capacitance C and the same tunnel resistance $R_T$. This structure is undesirable because the SET effect occurs in the junction for load resistor.

Row (b) shows the simulation result for a case where with the two insulator layers 31 and 33 formed to have the same dielectric constant, but different thickness, such as 20 nm and 2 nm, to prevent the occurrence of the SET effect in the junction for resistance. The capacitance for the junction for load resistor could be increased to a certain extent by reducing the insulation thickness down to 2 nm. However, the reduced insulator thickness made the tunnel resistance $R_T$ too small (0.1 $R_Q$). This makes the resistance of the load resistor comprising the junctions 121 to 124 too small for the TPL circuit to operate. With regard to the coupling capacitor, as the two insulator layers 31 and 33 have the same dielectric constant as in the case of row (a), the coupling capacitance C does not get sufficiently large, resulting in insufficient transmission of information between the gates.

Row (c) shows the simulation result for a case where the dielectric constant e1 of the insulator layer 31 of the SET junction element is set smaller than the dielectric constant e2 of the insulator layer 33 of the junctions of the load resistor, and the insulator layers between those electrodes had the same thickness. In this case, the junction for load resistor had a larger capacitance C than the single-electron junction and the tunnel resistance $R_T$ thereof could be increased to a certain extent. What is more, the capacitance C of the coupling junction could be made larger than those in rows (a) and (b) by increasing the dielectric constant e2. In other words, even if the tunnel resistance was increased by setting the layer thickness (the lateral distance) of the coupling junction sufficiently large, the capacitance C of the coupling junction could be set about the same as the capacitance of the SET junction by increasing the dielectric constant e2 of the coupling junction.

The most preferable capacitance C of the coupling junction is, for example, about a half the capacitance of the SET junction element. A very small coupling capacitance as those in rows (a) and (b) is not practical because the coupling between the gates is weak, but too large a coupling capacitance adversely affects the oscillation of the SET junction element. It is therefore desirable that the coupling capacitance is approximately a half the capacitance of the SET junction element. In row (c), the coupling capacitor is 1 aF, about a half the capacitance of the SET junction element.

As apparent from the above, while the simulated values in the table of FIG. 9 are not necessarily the optimal values, the aforementioned conditions for the junctions can be met by making the dielectric constant e1 of the first insulator layer 31, which forms the SET junction, smaller than the dielectric constant e2 of the second insulator layer 33 which forms the tunnel junction for forming the load resistor and the junction of the coupling capacitor. In addition, in the example in FIG. 9, as the thickness of the insulator layer 31 of the SET junction is set about the same as the thickness of the insulator layer 33 of the tunnel junction, it is expected that the fabrication becomes easier.

In the cross-sectional structure in FIG. 8, the first insulator layer 31 and the second insulator layer 33 may be formed by a combination of silicon oxide ($SiO_2$; a dielectric constant of 3.8 to 9) and silicon nitride ($Si_3N_4$; a dielectric constant of about 7), or a combination of silicon oxide and tantalum oxide ($Ta_2O_5$; a dielectric constant of about 25).

Further, the thickness of the insulator layer of the junction in the cross-sectional structure in FIG. 8 is determined to set the tunnel resistance to a set value as mentioned above. Because the insulator layers of the SET junction and the junction for load resistor should be thin enough to ensure tunneling, therefore, their thicknesses should be set to as thin as 20 nm. The distances between the electrodes of the SET junction elements of adjoining TPL gates is set longer (e.g., 200 nm) than the mentioned layer thickness, and the coupling capacitance can be set about the same as or half of the capacitance of the SET junction element, thus providing a sufficiently large tunnel resistance. In the case of constructing a circuit by combining a plurality of TPL gates, those TPL gates which need not be coupled can be electrically isolated from each other by, for example, setting a sufficient distance between the TPL gates. Alternatively, such TPL gates can be isolated by forming an insulator partition of a high dielectric constant between the TPL gates though not illustrated.

Further, to secure the freedom of design for the distance between TPL gates, the insulator between TPL gates is of a material having a third dielectric constant. Specifically, with the dielectric constant of the insulator between the electrodes 32 being the third dielectric constant, the third dielectric constant is selected to be smaller than the dielectric constants e1 and e2 when the distance between the electrodes 32 becomes short due to high integration or the like, and it is selected to be large when the distance between the electrodes 32 becomes long because of the limitation to the fabrication method, an increase in the number of gates to be coupled, or some other reason.

Figure 10:
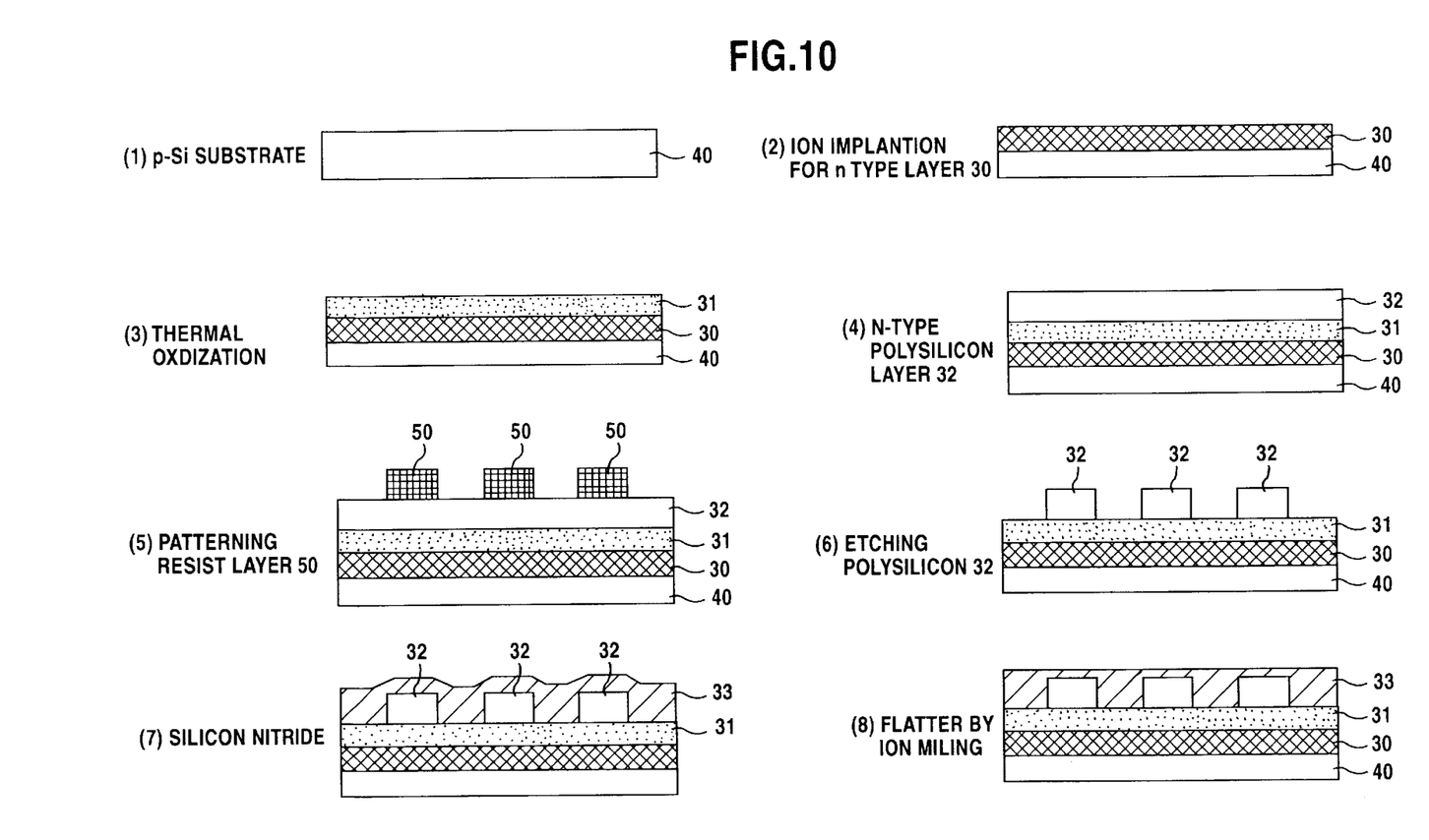
FIG. 10 is a diagram illustrating a method of fabricating a TPL phase-locked circuit structure.
Figure 11:
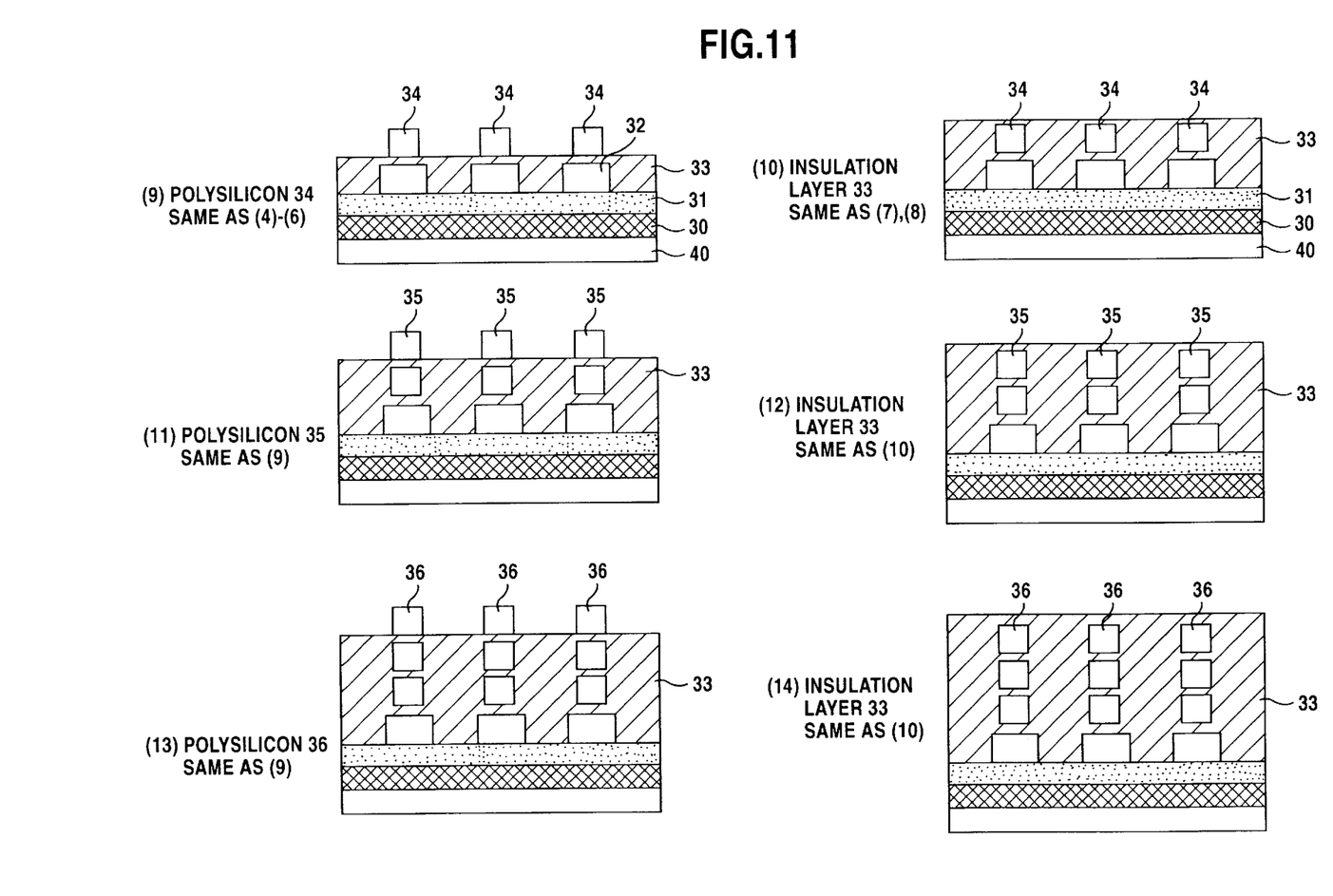
FIG. 11 is a diagram illustrating a method of fabricating the TPL phase-locked circuit structure.
Figure 12:
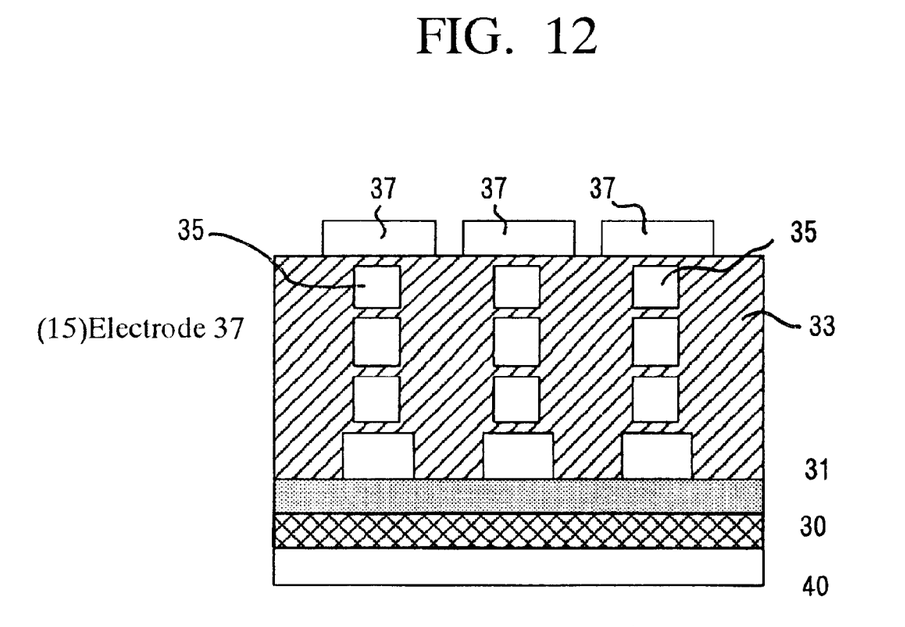
FIG. 12 is a diagram illustrating a method of fabricating the TPL phase-locked circuit structure.

FIGS. 10 through 12 are diagrams illustrating a method of fabricating a TPL phase-locked circuit structure. A fabrication method according to this embodiment will be described with reference to the cross-sectional views (1) to (15) which are arranged in the order of fabrication steps.

(1) and (2) in FIG. 10

Phosphorous ions are injected into the surface of a P type silicon substrate 40, and the resultant structure is annealed to form an n-type silicon layer 30. This silicon layer 30 becomes a common electrode of SET junction elements.

(3) and (4) in FIG. 10

A first insulator layer 31 of oxide silicon of 20 nm in thickness is formed on the surface of the silicon layer 30 by thermal oxidization. An n-type polysilicon layer 32 of 20 nm in thickness is grown on the insulator layer 31 by CVD.

(5) and (6) in FIG. 10

A resist layer is formed on the polysilicon layer 32 and is then patterned into a layout pattern 50 of the single-electron tunneling junctions of TPL circuits by electron beam drawing. Then, the polysilicon layer 32 is etched by ordinary dry etching to form the other electrodes of the single-electron tunneling junctions, which are isolated and arranged two-dimensionally. Those electrodes 32 are two-dimensionally arranged apart from one another. Each electrode 32 together with the common electrode 30 and the first insulator layer 32 between those electrodes 32 and 30 constitutes a single-electron tunneling junction element.

(7) and (8) in FIG. 10

Next, a second insulator layer of silicon nitride is grown 60-nm thick on the polysilicon electrode 32 and the first insulator layer 31 by CVD. Then, a resist is coated on the entire surface and the resultant entire surface is etched by ion milling using argon while being flattened until the silicon nitride layer on the electrode 32 becomes 20 nm. This silicon nitride layer becomes the tunnel junction for the load resistor.

(9) and (10) in FIG. 11

The other electrode 34 of polysilicon layer of the tunneling junction element is formed on the insulator layer 33 of silicon nitride by the same steps as the steps (4) to (6). Then, a silicon nitride layer 33 is formed 20-nm thick on the electrode 34 by the same steps as the steps (7) and (8).

(11) to (14) in FIG. 11

An electrode 35 of polysilicon is formed and a second insulator layer 33 of silicon nitride is deposited on the electrode 35 by the same steps as the steps (9) and (10). This silicon nitride layer is formed also 20-nm thick on the electrode 35. This process is repeated to form an electrode of polysilicon 36 and a silicon nitride layer 33 which covers the electrode 36. This silicon nitride layer is likewise formed 20-nm thick on the electrode 35.

FIG. 12

Finally, the topmost layer of electrode 37 is formed by forming an inverting resist pattern of an electrode pattern on the surface of the second insulator layer 33 of silicon nitride, vapor-depositing aluminum in a thickness of 50 nm, and lifting off and removing the resist. As a result, four rows of multiple tunnel junctions are formed.

As described above, the TPL circuit device with the structure as shown in FIG. 8 can be constructed by using semiconductor fabrication steps which are currently available. The lamination of the SET junction element and the tunneling junction elements for forming the load resistor can make a TPL circuit compact. Separately selecting the materials for both insulator layers can allow both junctions to have the demanded capacitances and tunnel resistances even when the insulator layers of those junctions have the same thickness. Further, the coupling capacitor which has the proper capacitance and tunnel resistance can be formed by adjusting the distance between the electrodes of adjoining SET junction elements.

According to this invention, as explained above, a TPL circuit with lower dissipation power can be constructed by forming an SET junction element and tunneling junction elements for a load resistor to be connected to the SET junction element by a multilayer structure of conductive layers and first and second insulator layers. It is thus possible to implement a TPL circuit device with a simple structure, which can be fabricated easily by using the existing semiconductor manufacture process.

Further, this invention can provide a TPL structure suitable for integration by forming the insulator layer of an SET junction element and the insulator layer of tunneling junction elements for a load resistor of materials with different dielectric constants, forming both junction elements into a lamination and implementing the coupling capacitor of the TPL circuit by the insulator layer between the electrodes of adjoining SET junction elements.

Furthermore, the load resistor can be implemented by series-connecting a plurality of tunneling junction elements in a multilayer structure. This structure can permit a TPL circuit to be designed compact.

What is claimed is:

1. A phase-locked circuit device comprising:

a single-electron tunneling junction element having ultrasmall tunnel junction;

a tunneling junction element for resistance having one end connected to a first electrode of said single-electron tunneling junction element and an other end applied with a DC bias voltage, said tunneling junction element for resistance forming a load resistor; and an AC voltage source for applying a voltage to a second electrode of said single-electron tunneling junction element, a junction of said single-electron tunneling junction element being formed by a first insulator layer, a junction of said tunneling junction element for resistance being formed by a second insulator layer having a larger dielectric constant than that of said first insulator layer.

2. The phase-locked circuit device according to claim 1, wherein said single-electron tunneling junction element and said tunneling junction element for resistance are formed in a multilayer structure.

3. The phase-locked circuit device according to claim 1, wherein said load resistor is constructed by connecting a plurality of tunneling junction elements for resistance in series, and said single-electron tunneling junction element and said plurality of tunneling junction elements for resistance are formed in a multilayer structure.

4. The phase-locked circuit device according to claim 2 or 3, wherein a plurality of phase-locked circuit gates each constituted of said single-electron tunneling junction element and said tunneling junction element for resistance are arranged apart from one another two-dimensionally, and a coupling capacitor between a preceding gate and a succeeding gate is constituted by a n insulator layer formed between said first electrodes.

5. The phase-locked circuit device according to claim 4, wherein said insulator or layer constituting said coupling capacitor comprises said second insulator layer.

6. The phase-locked circuit device according to claim 4, wherein said second electrodes of said single-electron tunneling junction elements of said plurality of phase-locked circuit gates are implemented by a common electrode.

7. A phase-locked circuit device comprising:

a plurality of single-electron tunneling junction elements having a first electrode layer commonly formed on a substrate, a first insulator layer formed on said first electrode layer and having a first dielectric constant and a plurality of second electrode layers formed apart from one another on said first insulator layer;

a tunneling junction element for resistance including a second insulator layer formed on said second electrode layers and said first insulator layer and having a second dielectric constant greater than said first dielectric constant, and a plurality of electrode layers for resistance formed on said second insulator layer and isolated at positions corresponding to said second electrode layers; and a coupling capacitor formed between the second electrode layers of said single-electron tunneling junction elements, a DC bias voltage being applied to said electrode layers for resistance, an AC pump voltage being applied to said first electrode layer of said single-electron tunneling junction element.

8. The phase-locked circuit device according to claim 7, wherein said first insulator layer of said single-electron tunneling junction element and said second insulator layer of said tunneling junction element for resistance have substantially the same thickness.

* * * * *